US006121066A

United States Patent [19]

Ju et al.

[11] Patent Number: 6,121,066

[45] Date of Patent: Sep. 19, 2000

[54] METHOD FOR FABRICATING A FIELD EMISSION DISPLAY

[75] Inventors: Byeong Kwon Ju; Myung Hwan Oh; Yun Hi Lee, all of Seoul, Rep. of Korea

[73] Assignee: Korea Institute of Science and Technology, Rep. of Korea

[21] Appl. No.: 08/648,844

[22] Filed: May 15, 1996

[30] Foreign Application Priority Data

Nov. 18, 1995 [KR] Rep. of Korea ...................... 95/42129

[51] Int. Cl.[7] ........................ H01L 21/00

[52] U.S. Cl. ........................ 438/20; 438/105; 438/228

[58] Field of Search ........................ 437/227, 228; 216/24, 25, 67; 438/20, 105, 228

[56] References Cited

U.S. PATENT DOCUMENTS

| | | | |
|---|---|---|---|
| 5,529,524 | 6/1996 | Jones | 445/24 |
| 5,772,904 | 6/1995 | Kim | 216/24 |
| 5,827,752 | 7/1996 | Ju et al. | 438/20 |

OTHER PUBLICATIONS

Okano et al., "Fabrication of a diamond field emitter array", *Appl. Phys. Lett.*, vol. 64, No. 20, pp. 2742–2744 (1994).

*Primary Examiner*—Chandra Chaudhari
*Assistant Examiner*—Reneé R. Berry
*Attorney, Agent, or Firm*—Townsend and Townsend and Crew

[57] ABSTRACT

A field emission display and a method for fabricating the same are disclosed. The method includes the steps of: forming a silicon mold; growing a diamond on the silicon mold, to form a diamond tip; forming a conductive layer on the diamond tip; bonding a first substrate to the conductive layer; removing the silicon mold; forming a gate insulating layer and gate electrode on the diamond tip; and etching the gate electrode and gate insulating layer to expose an electron emission portion of the tip, and thereby form a gate hole. By doing so, the operation voltage is reduced, compared with the diode-type display, and high-responsibility field emission display can be realized by applying (−) or (+) voltage to the gate electrode.

4 Claims, 3 Drawing Sheets

METHOD FOR FABRICATING A FIELD EMISSION DISPLAY

BACKGROUND OF THE INVENTION

The present invention relates to a field emission display and a method for fabricating the same, and more particularly, to a triode field emission display fabricated using a diamond, and a method for fabricating the same.

The work function of a diamond for use as a material for a field emission display is so low that electrons are emitted easily, as compared with metal and semiconductor, and its thermal conductivity is high. Also, it is chemically stable and mechanically strong. Accordingly, in case that a diamond tip or a tip on which a diamond layer is coated is used, it is possible to obtain more stable electric field emission at a lower voltage.

The diamond is not fabricated easily into a form of tip, and emits electrons in a relatively low electric field. By using this, a diode-structure field emission display constructed only of cathode and anode has been proposed. However, the diode-structure field emission display fabricated using the diamond has the following problems. First, it is required that the surface of the diamond of the field emitting portion is located to keep a distance from the anode by tens of μm using a spacer. Secondly, instead of capability of obtaining electric field emission at a low voltage, electrons may be emitted even in a state in which voltage is not applied. Thus, emission current according to the applied voltage is controlled unstably.

SUMMARY OF THE INVENTION

It is an object of the present invention to provide a field emission display and a method for fabricating the same in which a triode field emission display is fabricated using a diamond tip, to thereby reduce the operation voltage but and stably control the electric field emission from the tip using a gate electrode.

To accomplish the object of the present invention, there is provided a field emission display including: a substrate; a conductive layer formed on the substrate; a diamond tip formed on the conductive layer and formed in a structure that a plurality of pillars having a pointed end and a predetermined height are spaced apart from one another; a gate insulating layer formed on the surface of the tip, to expose the pointed end of the tip; and a gate electrode formed on the gate insulating layer.

For the object of the present invention, there is further provided a field emission display including: a substrate; a conductive layer formed on the substrate; a tip formed on the conductive layer and formed in a structure that a plurality of pillars having a pointed end and a predetermined height are spaced apart from one another; a diamond thin film formed on the overall surface of the tip; a gate insulating layer formed on the surface of the tip, to expose said pointed end of the tip; and a gate electrode formed on the gate insulating layer. To accomplish the object of the present invention, there is further provided a method for fabricating a field emission display including the steps of: forming a silicon mould; growing a diamond on the silicon mould, to form a diamond tip; forming a conductive layer on the diamond tip; bonding a first substrate to the conductive layer; removing the silicon mould; forming a gate insulating layer and gate electrode on the diamond tip; and etching the gate electrode and gate insulating layer to expose an electron emission portion of the tip, and thereby form a gate hole.

For the object of the present invention, there is further provided a method for fabricating a field emission display including the steps of: forming a silicon mould; forming a diamond thin film on the silicon mould, and then forming a tip on the diamond thin film; forming a conductive layer on the tip; bonding a substrate to the conductive layer; removing the silicon mould; forming a gate insulating layer and gate electrode on the diamond thin film; and etching the gate electrode and gate insulating layer to expose an electron emission portion of the tip on which the diamond thin film is coated, and thereby form a gate hole.

As described above, a triode field emission display is fabricated using a diamond, to thereby more stably control the field emission from the tip using a gate electrode.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENT

Preferred embodiments of the present invention will be explained below with reference to the accompanying drawings.

Figure 1A:
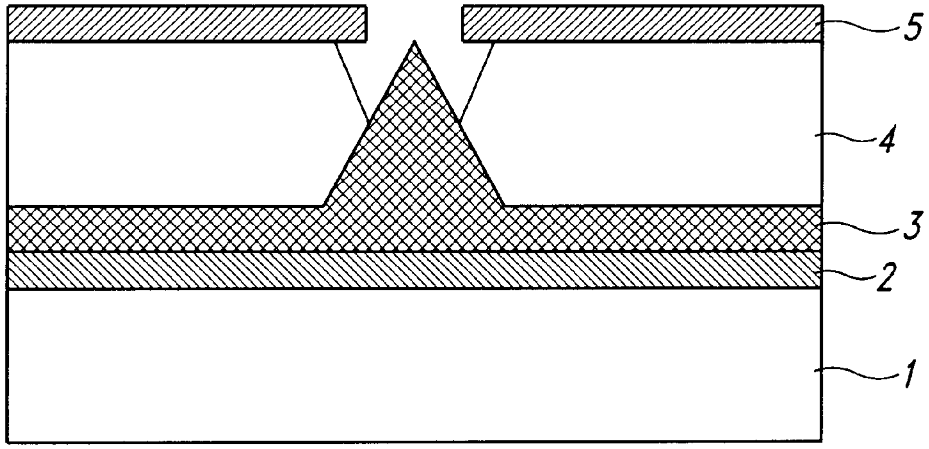
FIG. 1A is a cross-sectional view of a field emission display fabricated using a diamond tip according to a first embodiment of the present invention.
Figure 1B:
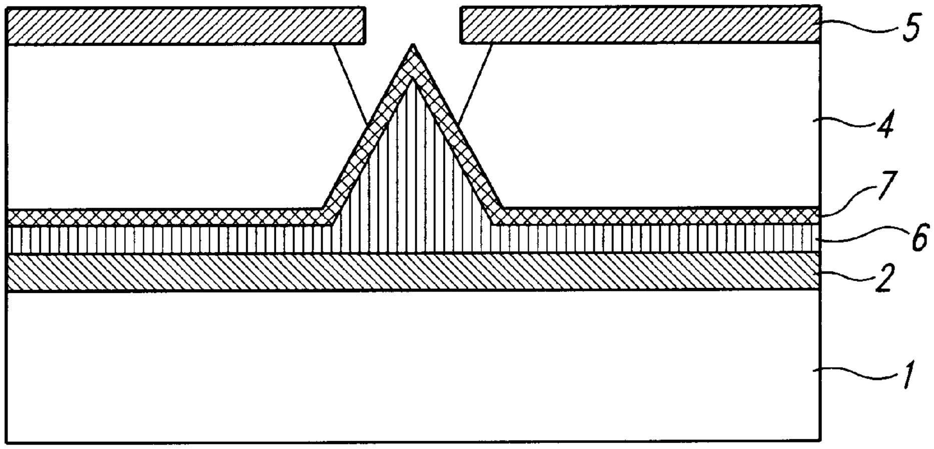
FIG. 1B is a cross-sectional view of a field emission display fabricated using a metal on which a diamond thin film is coated, or using a semiconductor tip, according to a second embodiment of the present invention.

FIGS. 1A and 1B are cross-sectional views of a triode-type field emission display using a diamond having structures of first and second embodiments of the present invention. As shown in FIG. 1A, the field emission display according to the first embodiment has a tip formed only of diamond, and consists of a substrate 1 formed of glass, semiconductor or metal, cathode 2 formed of conductive layer, diamond tip 3, gate insulating layer 4, and gate electrode 5.

As shown in FIG. 1B, the field emission display according to the second embodiment has a tip on which a diamond layer is coated. In this case, the field emission display has a similar structure to that of FIG. 1A, except that a diamond layer 7 is coated on tip 6. Methods for fabricating the field emission displays shown in FIGS. 1A and 1B will be explained below with reference to FIGS. 2A to 2H and FIGS. 3A to 3H. FIGS. 2A to 2H are cross-sectional views showing a method for fabricating the field emission display shown in FIG. 1A, and FIGS. 3A to 3H are cross-sectional views showing a method for fabricating the field emission display shown in FIG. 1B.

First, processes for fabricating the field emission display according to the first embodiment of the present invention will be explained below. Here, processes for fabricating the diamond tip shown in FIGS. 2A to 2F follow the method using a silicon mould, which is proposed in the method for fabricating a micro-tip for emitting electric field disclosed in Korean Patent Application No. 95-36760.

Figure 2A:
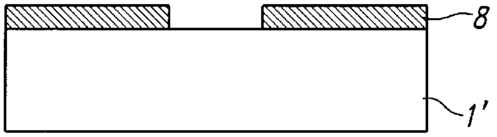
FIGS. 2A to 2H are cross-sectional views showing the process of fabricating the field emission display shown in FIG. 1A.
Figure 2B:
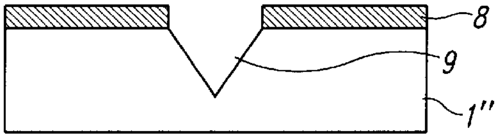

As shown in FIG. 2A, an etch mask 8 patterned into a form of rectangle or square is formed on a single-crystalline silicon substrate 1' to be aligned to a specific orientation face of the substrate 1. Then, silicon substrate 1' is orientation-dependent etched using etch mask 8, to thereby form a groove 9 having a specific orientation face as shown in FIG. 2B. This silicon substrate on which groove 9 is formed is used as a mould.

Figure 2C:
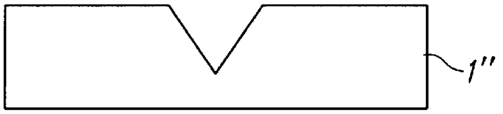
Figure 2D:
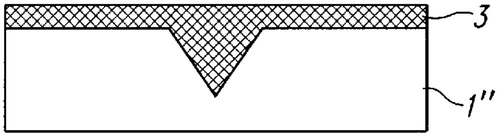
Figure 2E:
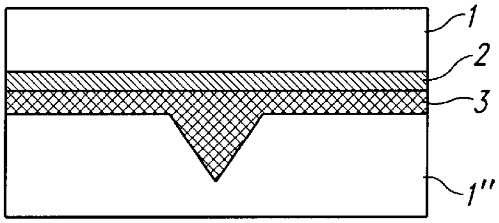
Figure 2F:
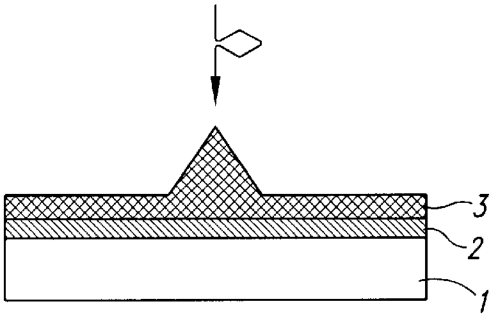

As shown in FIG. 2C, etch mask 8 is removed to form mould 1", and a diamond 3 is grown in mould 1". By doing so, as shown in FIG. 2D, diamond is formed according to the shape of mould 1'. Then, as shown in FIG. 2E, a conductive thin film used as cathode 2 is formed on diamond 3, and a substrate 1 formed of glass, semiconductor or metal is bonded to conductive thin film 2 using metallic bonding. As shown in FIG. 2F, silicon mould 1" is removed through wet etch, accomplishing the micro-tip formed only of diamond. Here, diamond tip 3 is formed in various shapes, such as pyramid or stripe, depending on the shape of etch mask 8.

Figure 2G:
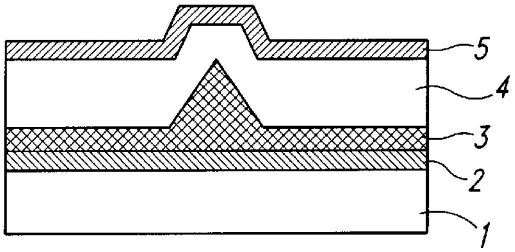
Figure 2H:
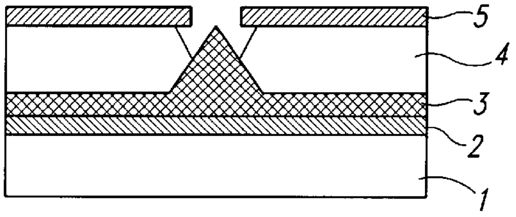

As shown in FIG. 2G, a gate insulating layer 4 is formed on the overall surface of tip 3, to cover diamond tip 3, and a gate electrode 5 is formed on gate insulating layer 4. As shown in FIG. 2H, gate electrode 5 and gate insulating layer 4 are etched to expose the pointed portion of diamond tip 3 from which electrons are emitted through photolithography, to thereby form a gate hole. Then, an anode substrate on which a light-transmitting transparent electrode and luminescent layer are formed is bonded to the substrate on which the diamond tip is formed, to have a predetermined distance, corresponding to diamond tip 3 using a spacer. By doing so, processes for fabricating the triode field emission display are completed.

Figure 3A:
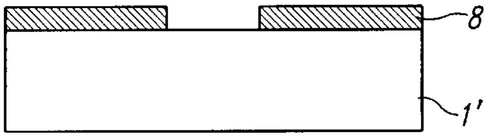
FIGS. 3A to 3H are cross-sectional views showing the process of fabricating the field emission display shown in FIG. 1B.
Figure 3B:
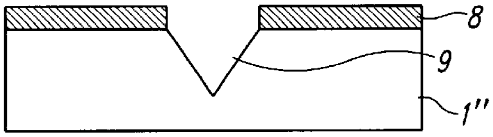
Figure 3C:
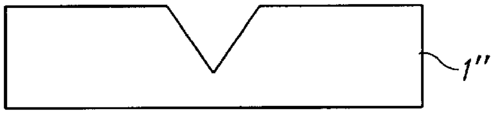

Processes for fabricating the field emission display according to the second embodiment will be explained below with reference to FIGS. 3A to 3H. Here, processes shown in FIGS. 3A to 3F for fabricating metal or semiconductor tip on which a diamond layer is coated follow the method using a silicon mould, which is proposed in the method for fabricating a micro-tip for emitting electric field disclosed in Korean Patent Application No. 95-36760. The processes shown in FIGS. 3A to 3C are the same as those in FIGS. 2A to 2C. Accordingly, it will be explained after the process of FIG. 3C.

Figure 3D:
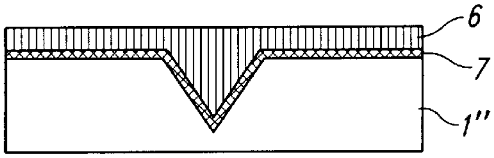
Figure 3E:
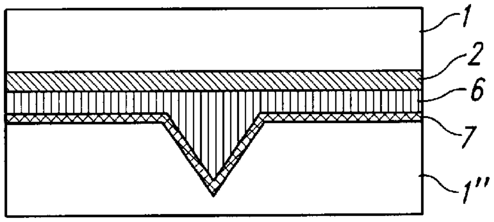

That is, after the formation of silicon mould 1" having a shape shown in FIG. 3C, a diamond layer 7 is coated on the mould as shown in FIG. 3D. As a result, diamond layer 7 is formed into a shape following the surface structure of the mould. Then, a material for tip like semiconductor or metal is deposited on diamond layer 7 through thin film deposition, printing or electro-plating, to thereby form a tip 6. As shown in FIG. 3E, a conductive layer used as a cathode 2 is formed on tip 6, and a substrate 1 formed of glass, semiconductor or metal is bonded to the conductive layer using metallic bonding.

Figure 3F:
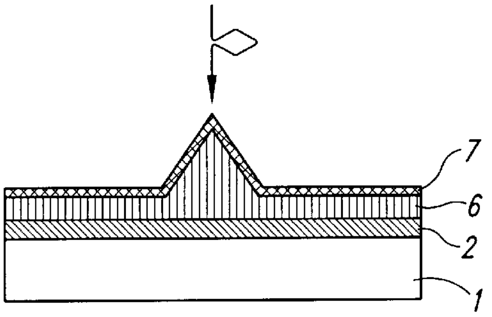
Figure 3G:
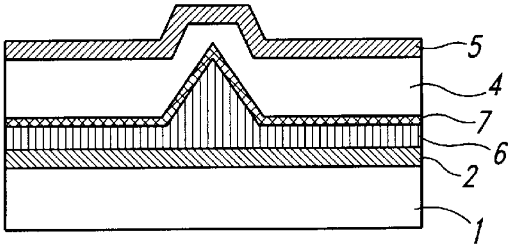
Figure 3H:
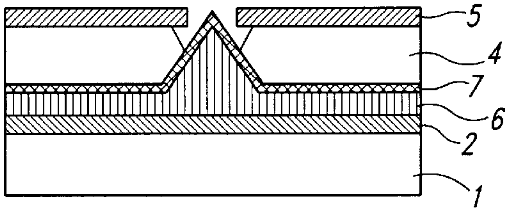

Then, as shown in FIG. 3F, silicon mould 1" is removed through wet etch; accomplishing a tip on which the diamond layer is coated. The processes shown in FIGS. 3G to 3H are the same as those in FIGS. 2G to 2H. Accordingly, explanations for them will be omitted. Finally, an anode substrate, on which a light-transmitting transparent electrode and luminescent layer are formed, is bonded to the substrate on which the diamond tip is formed, to have a predetermined distance, corresponding to diamond tip 3, using a spacer. By doing so, processes for fabricating the triode field emission display is completed.

According to the present invention, the distance between the tip and gate electrode can be controlled within several μms through a standard semiconductor fabrication process. Therefore, the operation voltage is reduced, compared with the diode-type display. Also, field emission characteristics are not much dependant on the distance between the tip and anode, unsimilar to that of the diode-type, thereby fabricating the display easily. Moreover, by applying (−) or (+) voltage to the gate electrode, high-responsibility field emission display can be realized, which is capable of stably controlling the field emission from the tip using the gate electrode.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed:

1. A method for fabricating a field emission display comprising the steps of:

forming a silicon mould;

growing a diamond on said silicon mould, to form a diamond tip;

forming a conductive layer on said diamond tip;

bonding a first substrate to said conductive layer;

removing said silicon mould;

forming a gate insulating layer and gate electrode on said diamond tip; and etching said gate electrode and gate insulating layer to expose an electron emission portion of said tip, and thereby form a gate hole.

2. The method for fabricating a field emission display, as claimed in claim 1, wherein said step of forming said silicon mould comprises:

forming an etch mask on a silicon substrate, to expose a portion of said silicon substrate;

orientation-dependant etching said silicon substrate using said etch mask, to form a groove; and removing said etch mask.

3. A method for fabricating a field emission display comprising the steps of:

forming a silicon mould;

forming a diamond thin film on said silicon mould, and then forming a tip on said diamond thin film;

forming a conductive layer on said tip;

bonding a substrate to said conductive layer;

removing said silicon mould;

forming a gate insulating layer and gate electrode on said diamond thin film; and etching said gate electrode and gate insulating layer to expose an electron emission portion of said tip on which said diamond thin film is coated, and thereby form a gate hole.

4. The method for fabricating a field emission display, as claimed in claim 3, wherein said step of forming said silicon mould comprises:

forming an etch mask on a silicon substrate, to expose a portion of said silicon substrate;

orientation-dependant etching said silicon substrate using said etch mask, to form a groove; and removing said etch mask.

* * * * *